United States Patent
Watanabe et al.

(10) Patent No.: US 8,995,181 B2
(45) Date of Patent: Mar. 31, 2015

(54) MAGNETORESISTIVE ELEMENT

(71) Applicants: Daisuke Watanabe, Kai (JP); Youngmin Eeh, Kawagoe (JP); Kazuya Sawada, Morioka (JP); Koji Ueda, Fukuoka (JP); Toshihiko Nagase, Tokyo (JP)

(72) Inventors: Daisuke Watanabe, Kai (JP); Youngmin Eeh, Kawagoe (JP); Kazuya Sawada, Morioka (JP); Koji Ueda, Fukuoka (JP); Toshihiko Nagase, Tokyo (JP)

(*) Notice: Subject to any disclaimer, the term of this patent is extended or adjusted under 35 U.S.C. 154(b) by 43 days.

(21) Appl. No.: 13/963,654

(22) Filed: Aug. 9, 2013

(65) Prior Publication Data

US 2014/0286084 A1    Sep. 25, 2014

Related U.S. Application Data

(60) Provisional application No. 61/804,002, filed on Mar. 21, 2013.

(51) Int. Cl.
*G11C 11/00* (2006.01)
*G11C 11/16* (2006.01)
*H01L 43/02* (2006.01)

(52) U.S. Cl.
CPC ............. *G11C 11/161* (2013.01); *H01L 43/02* (2013.01)

USPC .......................................... 365/158; 365/171

(58) Field of Classification Search
USPC ......................................... 365/158, 171, 173
See application file for complete search history.

(56) References Cited

U.S. PATENT DOCUMENTS

| | | | |
|---|---|---|---|
| 8,279,657 B2 * | 10/2012 | Takagi et al. ................. | 365/148 |
| 2007/0014149 A1 | 1/2007 | Nagamine et al. | |
| 2012/0061781 A1 | 3/2012 | Ohmori et al. | |
| 2012/0069642 A1 | 3/2012 | Ueda et al. | |
| 2012/0070695 A1 | 3/2012 | Kitagawa et al. | |
| 2012/0161262 A1 | 6/2012 | Yuasa | |

* cited by examiner

*Primary Examiner* — Huan Hoang
(74) *Attorney, Agent, or Firm* — Holtz, Holtz, Goodman & Chick PC (57) ABSTRACT

According to one embodiment, a magnetoresistive element comprises a storage layer having perpendicular magnetic anisotropy with respect to a film plane and having a variable direction of magnetization, a reference layer having perpendicular magnetic anisotropy with respect to the film plane and having an invariable direction of magnetization, a tunnel barrier layer formed between the storage layer and the reference layer and containing O, and an underlayer formed on a side of the storage layer opposite to the tunnel barrier layer. The reference layer comprises a first reference layer formed on the tunnel barrier layer side and a second reference layer formed opposite the tunnel barrier layer. The second reference layer has a higher standard electrode potential than the underlayer.

20 Claims, 6 Drawing Sheets

FIG. 3B  Parallel state (low resistance)

FIG. 3C  Anti-parallel state (high resistance)

MAGNETORESISTIVE ELEMENT

CROSS-REFERENCE TO RELATED APPLICATIONS

This application claims the benefit of U.S. Provisional Application No. 61/804,002, filed Mar. 21, 2013, the entire contents of which are incorporated herein by reference.

FIELD

Embodiments described herein relate generally to a magnetoresistive element.

BACKGROUND

A spin transfer magnetic random access memory (MRAM) comprising, as a storage element, a magnetoresistive element with a ferromagnetic substance has been proposed. The MRAM is a memory that stores information by changing the direction of magnetization in a magnetic layer by a current transferred into the magnetoresistive element to control the electrical resistance of the magnetoresistive element between a high-resistance state and a low-resistance state.

The magnetoresistive element comprises a storage layer that is a ferromagnetic layer with a variable direction of magnetization, a reference layer that is a ferromagnetic layer with an invariable direction of magnetization, and a tunnel barrier layer that is a nonmagnetic layer formed between the storage layer and the reference layer. The tunnel barrier layer is formed of an oxide film, for example, MgO. In this case, the characteristics of the magnetoresistive element are affected depending on the distribution of concentration of oxygen (O) in the tunnel barrier layer (oxide film).

DETAILED DESCRIPTION

In general, according to one embodiment, a magnetoresistive element comprises: a storage layer having perpendicular magnetic anisotropy with respect to a film plane and having a variable direction of magnetization; a reference layer having perpendicular magnetic anisotropy with respect to the film plane and having an invariable direction of magnetization; a tunnel barrier layer formed between the storage layer and the reference layer and containing O; and an underlayer formed on a side of the storage layer opposite to the tunnel barrier layer. The reference layer comprises a first reference layer formed on the tunnel barrier layer side and a second reference layer formed opposite the tunnel barrier layer. The second reference layer has a higher standard electrode potential than the underlayer.

The present embodiment will be described below with reference to the drawings. In the drawings, the same components are denoted by the same reference numbers. Furthermore, duplicate descriptions will be provided as necessary.

<MRAM Basic Configuration Example>

An example of basic configuration of an MRAM will be described below with reference to FIG. 1 to FIG. 3.

Figure 1:
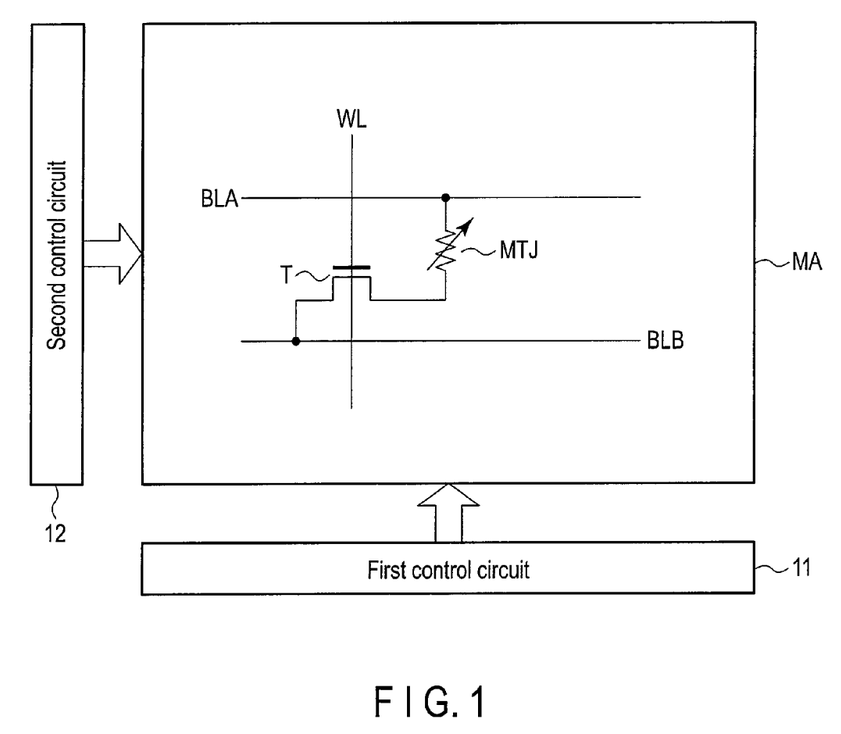
FIG. 1 is a circuit diagram showing a memory cell in an MRAM.

FIG. 1 is a circuit diagram showing a memory cell in the MRAM.

As shown in FIG. 1, a memory cell in a memory cell array MA comprises a series connected unit with a magnetoresistive element MTJ and a switch element (for example, an FET). One end of the series connected unit (one end of the magnetoresistive element MTJ) is connected to a bit line BLA. The other end of the series connected unit (one end of the switch element T) is connected to a bit line BLB. A control terminal of the switch element T, for example, a gate electrode of the FET, is connected to a word line WL.

The potential of the word line WL is controlled by a first control circuit 11. Furthermore, the potentials of the bit lines BLA and BLB are controlled by a second control circuit 12.

Figure 2:
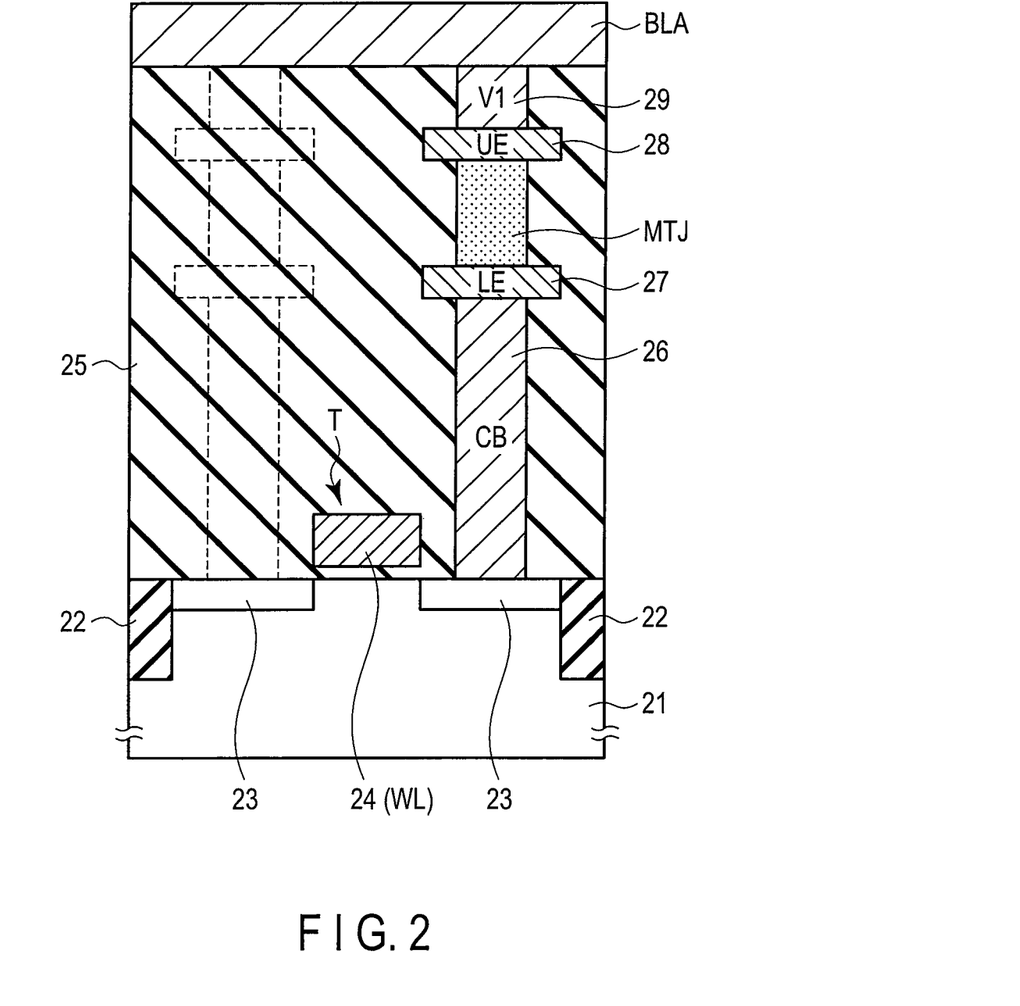
FIG. 2 is a cross-sectional view of the structure of the memory cell in the MRAM.

FIG. 2 is a cross-sectional view showing the structure of the memory cell in the MRAM.

As shown in FIG. 2, the memory cell comprises the switch element T and the magnetoresistive element MTJ both disposed on a semiconductor substrate 21.

The semiconductor substrate 21 is, for example, a silicon substrate and may have a P-type conductivity or an N-type conductivity. As isolation layers 22, for example, silicon oxide ($SiO_2$) layers of an STI structure are disposed in the semiconductor substrate 21.

The switch element T is disposed in a surface area of the semiconductor substrate 21, specifically, in an element area (active area) surrounded by the isolation layers 22. In the present example, the switch element T is an FET and comprises two source/drain diffusion layers 23 in the semiconductor substrate 21 and a gate electrode 24 disposed on a channel area between the source/drain diffusion layers 23. The gate electrode 24 functions as the word line WL.

The switch element T is covered with an interlayer insulating layer (for example, $SiO_2$) 25. A contact hole is formed in the interlayer insulating layer 25. A contact via 26 is disposed in the contact hole. The contact via 26 is formed of a metal material, for example, W or Cu.

A lower surface of the contact via 26 is connected to the contact via 26. In the present example, the contact via 26 is in direct contact with the source/drain diffusion layers 23.

A lower electrode (LE) 27 is disposed on a lower surface of the contact via 26. The lower electrode 27 comprises a stack structure of, for example, Ta (10 nm), Ru (5 nm), and Ta (5 nm).

The magnetoresistive element MTJ is disposed on the lower electrode 27, that is, immediately above the contact via 26. The magnetoresistive element MTJ according to the first embodiment will be described below in detail.

An upper electrode (UE) 28 is disposed on the magnetoresistive element MTJ. The upper electrode 28 is formed of, for example, TiN. The upper electrode 28 is connected to the bit line (for example, Cu) BLA through a via (for example, Cu) 29.

Figure 3A:
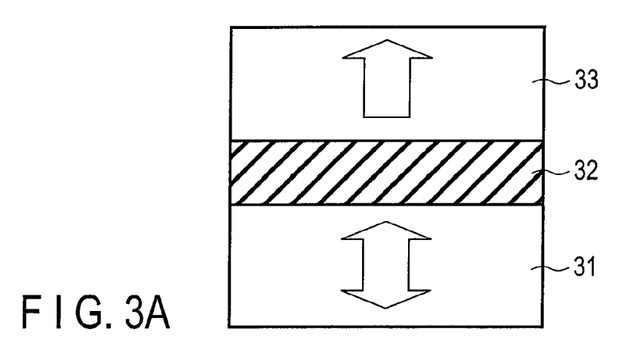
FIG. 3A is a cross-sectional view showing the structure of a magnetoresistive element.

FIG. 3A is a cross-sectional view showing the structure of the magnetoresistive element MTJ. Here, as the magnetoresistive element MTJ, a storage layer 31, a tunnel barrier layer 32, and a reference layer 33 are mainly illustrated.

As shown in FIG. 3A, the magnetoresistive element MTJ includes the storage layer 31 that is a ferromagnetic layer, the reference layer 33 that is a ferromagnetic layer, and the tunnel barrier layer 32 that is a nonmagnetic layer formed between the storage layer 31 and the reference layer 33.

The storage layer 31 is a ferromagnetic layer with a variable direction of magnetization and has perpendicular magnetic anisotropy that is perpendicular or almost perpendicular to a film plane (upper surface/lower surface). Here, the variable direction of magnetization indicates that the direction of magnetization changes depending on a predetermined write current. Furthermore, being almost perpendicular to the film plane means that the direction of residual magnetization is within the range of $45° < \theta \leq 90°$.

The tunnel barrier layer 32 is formed on the storage layer 31. The tunnel barrier layer 32 is a nonmagnetic layer and is formed of, for example, MgO.

The reference layer 33 is formed on the tunnel barrier layer 32. The reference layer 33 is a ferromagnetic layer with an invariable direction of magnetization and has perpendicular magnetic anisotropy that is perpendicular or almost perpendicular to the film plane. Here, the invariable direction of magnetization indicates that the direction of magnetization avoids changing depending on a predetermined write current. That is, the reference layer 33 has a greater inversion energy barrier in the direction of magnetization than the storage layer 31.

Figure 3B:
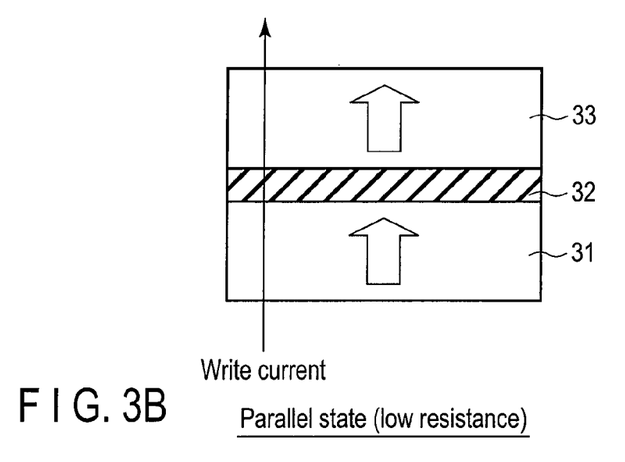
FIG. 3B is a cross-sectional view of the magnetoresistive element in a parallel state, illustrating a write operation performed on the magnetoresistive element.
Figure 3C:
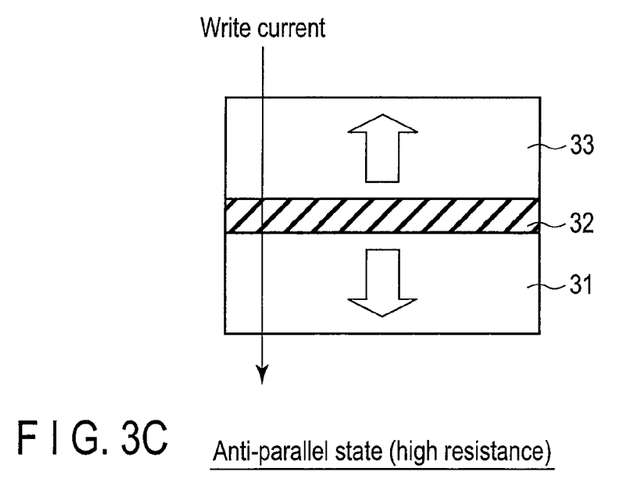
FIG. 3C is a cross-sectional view of the magnetoresistive element in an anti-parallel state, illustrating a write operation performed on the magnetoresistive element.

FIG. 3B is a cross-sectional view of the magnetoresistive element MTJ in a parallel state, illustrating a write operation performed on the magnetoresistive element MTJ. FIG. 3C is a cross-sectional view of the magnetoresistive element MTJ in an anti-parallel state, illustrating a write operation performed on the magnetoresistive element MTJ.

The magnetoresistive element MTJ is, for example, a spin transfer magnetoresistive element. Thus, if data is written to the magnetoresistive element MTJ or data is read from the magnetoresistive element MTJ, a current is passed bidirectionally through the magnetoresistive element MTJ in the directions perpendicular to the film plane.

More specifically, data is written to the magnetoresistive element MTJ as described below.

If a current flows from the lower electrode 27 to the upper electrode 28, that is, electrons are fed from the upper electrode 28 side (the electrons are directed from the reference layer 33 to the storage layer 31), electrons spin-polarized in the same direction as the direction of magnetization in the reference layer 33 are transferred into the storage layer 31. In this case, the direction of magnetization in the storage layer 31 is aligned with the direction of magnetization in the reference layer 33. This makes the direction of magnetization in the reference layer 33 and the direction of magnetization in the storage layer 31 parallel to each other. In this parallel state, the magnetoresistive element MTJ has the smallest resistance. This case is defined as, for example, binary 0.

On the other hand, if a current flows from the upper electrode 28 to the lower electrode 27, that is, electrons are fed from the lower electrode 27 side (the electrons are directed from the storage layer 31 to the reference layer 33), electrons spin-polarized in a direction opposite to the direction of magnetization in the reference layer 33 by being reflected by the reference layer 33 are transferred into the storage layer 31. In this case, the direction of magnetization in the storage layer 31 is aligned with the direction opposite to the direction of magnetization in the reference layer 33. This makes the direction of magnetization in the reference layer 33 and the direction of magnetization in the storage layer 31 anti-parallel to each other. In this anti-parallel state, the magnetoresistive element MTJ has the largest resistance. This case is defined as, for example, binary 1.

Furthermore, data is read from the magnetoresistive element MTJ as described below.

A read current is supplied to the magnetoresistive element MTJ. The read current is set to prevent the direction of magnetization in the storage layer 31 from being inverted (the read current is smaller than the write current). Binary 0 and 1 can be read by detecting a change in the resistance of the magnetoresistive element MTJ at the time of the setting of the read current.

First Embodiment

The magnetoresistive element MTJ according to a first embodiment will be described with reference to FIG. 4 and FIG. 5. The first embodiment is an example in which the storage layer 31 with a high standard electrode potential E and an underlayer 41 with a low standard electrode potential E are formed below the tunnel barrier layer 32 and in which a first reference layer 33A with a low standard electrode potential E and a second reference layer 33B with a high standard electrode potential E are formed above the tunnel barrier layer 32. Thus, the O concentration in the tunnel barrier layer 32 can be made constant, allowing the reliability of the tunnel barrier layer 32 to be improved. The first embodiment will be described below.

Structure According to the First Embodiment

The structure of the magnetoresistive element MTJ according to the first embodiment will be described below with reference to FIG. 4.

Figure 4:
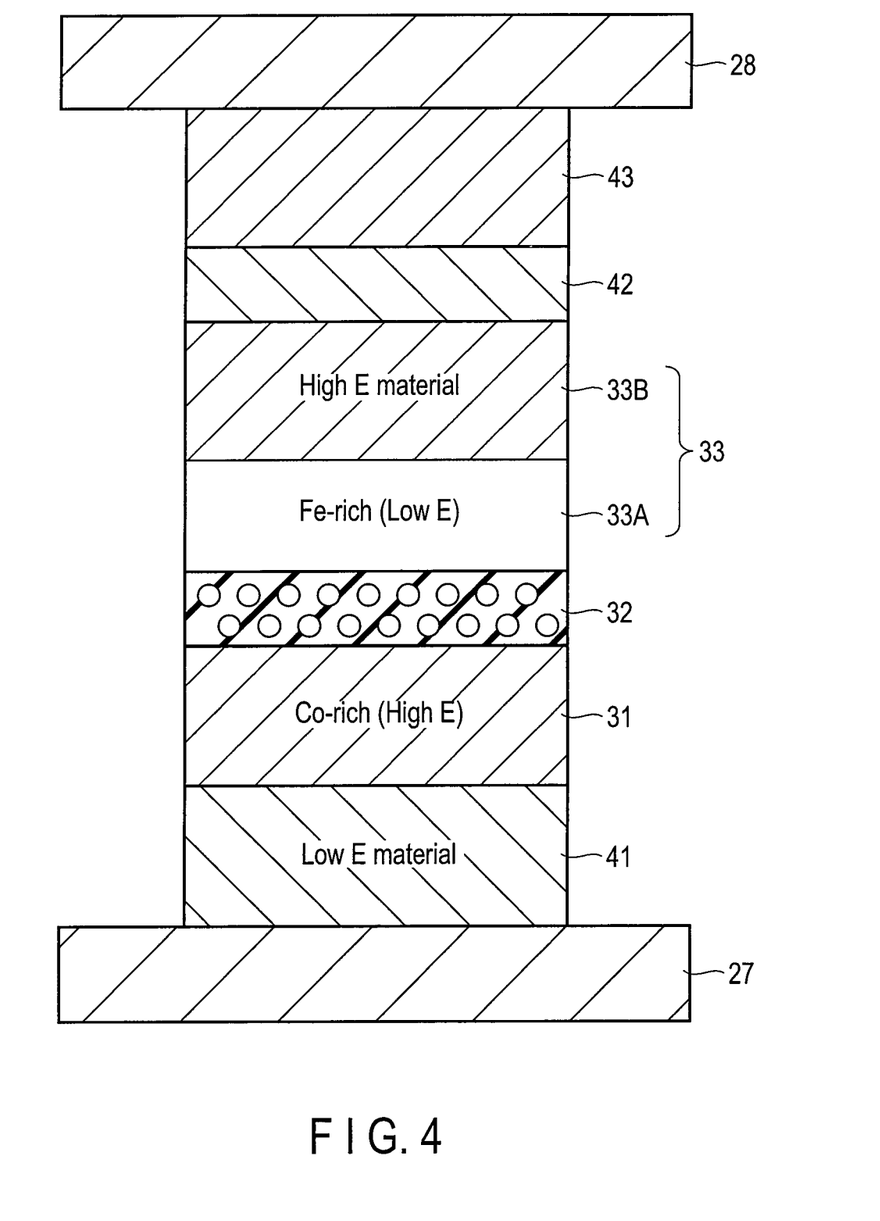
FIG. 4 is a cross-sectional view showing the structure of a magnetoresistive element according to a first embodiment.

FIG. 4 is a cross-sectional view showing the structure of the magnetoresistive element MTJ according to the first embodiment.

As shown in FIG. 4, the magnetoresistive element MTJ comprises the underlayer 41, the storage layer 31, the tunnel barrier layer 32, the reference layer 33, an intermediate layer 42, and a shift cancelling layer 43.

The underlayer 41 is formed on the lower electrode 27. The underlayer 41 contains a nonmagnetic material having a lower standard electrode potential E than the second reference layer 33B described below. Such a nonmagnetic material may be, for example, Hf, but is not limited to this. Examples of the nonmagnetic material include Hf, Ta, Nb, Al, Ti, and oxides or nitrides thereof. Alternatively, alloys or stack films of these materials may be used. Hf, Ta, Nb, Al, and Ti are −1.55, −0.60, −1.10, −1.66, and −1.63 V, respectively, in standard electrode potential E.

Furthermore, the film thickness of the underlayer 41 is desirably greater than the film thickness of the storage layer 31 and is, for example, about 5 nm.

The storage layer 31 is formed on the underlayer 41. The storage layer 31 contains ferromagnetic materials, for example, Co and Fe. Furthermore, B is added to the ferromagnetic materials in order to adjust saturation magnetization, magneto crystalline anisotropy, or the like. That is, the storage layer 31 is formed of a compound, for example, CoFeB. The storage layer 31 has a relatively high Co concentration (is Co rich) in order to suppress oxidation of the storage layer 31 (particularly Fe) in a process of oxidizing redeposits (reattachments) on a sidewall as described below. Here, being Co rich refers to having a Co ratio higher than stoichiometry.

The Co concentration of the Co—Fe alloy in the storage layer 31 is higher than the Co concentration of the Co—Fe alloy in the first reference layer 33A described below and is, for example, about 30 atm % or more and 70 atm % or less. Here, the concentration is mainly indicative of an atomic ratio. Furthermore, the storage layer 31 is formed of a CoFeB alloy, but the Co concentration (or Fe concentration) is indicative of the rate of Co (Fe) in a composition of only Co and Fe. In other words, it is assumed herein that the Co concentration plus the Fe concentration equals 100 atm %.

Furthermore, the film thickness of the storage layer 31 is desirably smaller than the film thickness of the underlayer 41 and is, for example, about 2 nm.

The tunnel barrier layer 32 is formed on the storage layer 31. The tunnel barrier layer 32 contains a nonmagnetic material, for example, MgO. However, the tunnel barrier layer 32 is not limited to the nonmagnetic material but may contain a metal oxide such as $Al_2O_3$, MgAlO, ZnO, or TiO. The O concentration in the tunnel barrier layer 32 is constant. In other words, the O concentration in the tunnel barrier layer 32 is the same on the storage layer 31 side and on the reference layer 33 side in the tunnel barrier layer 32.

The O concentration in the tunnel barrier layer 32 is not necessarily be constant and may be higher either on the storage layer 31 side or on the reference layer 33 side in the tunnel barrier layer 32 to the degree that the reliability of the tunnel barrier layer 32 is not degraded. Furthermore, the O concentration in the tunnel barrier layer 32 may be higher on the storage layer 31 side than on the reference layer 33 side in order to increase the perpendicular magnetic anisotropy of the storage layer 31.

Here, the constant O concentration includes an O concentration that is substantially constant to the degree that various characteristics remain unchanged.

The reference layer 33 is formed on the tunnel barrier layer 32. The reference layer 33 is formed of a first reference layer 33A on a lower side and a second reference layer 33B on an upper side.

The first reference layer 33A is formed on the tunnel barrier layer 32. The reference layer 33A contains ferromagnetic materials, for example, Co and Fe. Furthermore, B is added to the ferromagnetic materials in order to adjust saturation magnetization, magneto crystalline anisotropy, or the like. That is, like the storage layer 31, the first reference layer 33A is formed of a compound, for example, CoFeB.

The first reference layer 33A has a relatively high Fe concentration (is Fe rich) in order to increase perpendicular magnetic anisotropy. Here, being Fe rich refers to having an Fe ratio higher than stoichiometry. The Fe concentration of the Co—Fe alloy in the first reference layer 33A is higher than the Fe concentration of the Co—Fe alloy in the storage layer 31 and is, for example, about 70 atm % or more. Furthermore, the film thickness of the first reference layer 33A is desirably smaller than the film thickness of the second reference layer 33B and is, for example, about 1.5 nm.

Here, Fe is lower than Co in standard electrode potential E. More specifically, Fe is −0.45 V in standard electrode potential E, and Co is −0.28 V in standard electrode potential E. Thus, for the first reference layer 33A and the storage layer 31, both of which are formed of CoFeB, the first reference layer 33A, which has a higher Fe concentration (lower Co concentration), has a lower standard electrode potential E than the storage layer 31, which has a lower Fe concentration (higher Co concentration).

The second reference layer 33B is formed on the first reference layer 33A. The second reference layer 33B contains a nonmagnetic material having a higher standard electrode potential E than the underlayer 41. Such a nonmagnetic material may be Pt. Furthermore, the second reference layer 33B contains a magnetic material, for example, Co. That is, the second reference layer 33B is formed of, for example, a stack film of Pt and Co. The stack film is formed by stacking a plurality of Pt layers and a plurality of Co layers on one another. The nonmagnetic material with the high standard electrode potential E is not limited to Pt but may be Pd, Ru, or W. The standard electrode potentials of Pt, Pd, Ru, and W are 1.18 V, 0.95 V, 0.46 V, and 0.10 V, respectively.

Furthermore, the film thickness of the second reference layer 33B is greater than the film thickness of the first reference layer 33A and is, for example, about 6 nm.

The shift cancelling layer 43 is formed on the reference layer 33 (second reference layer 33B) via the intermediate layer 42. The intermediate layer 42 contains a conductive material, for example, Ru. The shift cancelling layer 43 is a magnetic layer with an invariable direction of magnetization and has perpendicular magnetic anisotropy perpendicular or almost perpendicular to the film plane. Furthermore, the direction of magnetization in the shift cancelling layer 43 is opposite to the direction of magnetization in the reference layer 33. This allows the shift cancelling layer 43 to cancel a leakage magnetic field leaking from the reference layer 33 to the storage layer 31. In other words, the shift cancelling layer 43 is effective for adjusting an offset of inversion characteristics of the storage layer 31 caused by a leakage magnetic field from the reference layer 33, to the opposite direction. The shift cancelling layer 43 is formed of a superlattice or the like comprising a stack structure of a magnetic material such as Ni, Fe, or Co and a nonmagnetic material such as Cu, Pd, or Pt. The upper electrode 28 is formed on the shift cancelling layer 43.

As described above, according to the first embodiment, the storage layer 31 with the high Co concentration (with the high standard electrode potential E) and the underlayer 41 with the low standard electrode potential E are formed below the tunnel barrier layer 32. Furthermore, the first reference layer 33A with the high Fe concentration (with the low standard electrode potential E) and the second reference layer 33B with the high standard electrode potential E are formed above the tunnel barrier layer 32. This enables a reduction in the potential (electric field) applied to the tunnel barrier layer 32, allowing the 0 concentration in the tunnel barrier layer 32 to be made constant.

Although not shown in the drawings, an intermediate layer not shown in the drawings (for example, Ta) may be formed between the first reference layer 33A and the second reference layer 33B.

Furthermore, the underlayer 41, the storage layer 31, the tunnel barrier layer 32, the reference layer 33, the intermediate layer 42, and the shift cancelling layer 43 all have a circular planar shape. Thus, the magnetoresistive element MTJ is formed like a pillar. However, the planar shape of the magnetoresistive element MTJ is not limited to the pillar shape but may be a square, a rectangle, or an ellipse.

Additionally, the storage layer 31 and the reference layer 33 may differ in planar dimensions. For example, the reference layer 33 may have a smaller planar diameter than the storage layer 31. As a sidewall of the reference layer 33, an insulating layer may be formed which is sized to be equivalent to the difference in dimensions between the storage layer 31 and the reference layer 33. This allows possible electrical short circuiting between the storage layer 31 and the reference layer 33 to be prevented.

In addition, the components of the magnetoresistive element MTJ may be arranged in reverse order. That is, the components may be formed on the lower electrode 27 in the following order: the shift cancelling layer 43, the intermediate layer 42, the second reference layer 33B, the first reference layer 33A, the tunnel barrier layer 32, the storage layer 31, and the underlayer 41.

Method for Manufacturing According to the First Embodiment

A method for manufacturing the magnetoresistive element MTJ according to the first embodiment will be described below with reference to FIG. 4.

First, an underlayer 41 is formed on the lower electrode 27 by, for example, a sputtering method. The underlayer 41 contains a nonmagnetic material having a lower standard electrode potential E than the second reference layer 33B. Examples of the nonmagnetic material include Hf, Ta, Nb, Al, Ti, and oxides and nitrides thereof.

Then, a storage layer 31 is formed on the underlayer 41 by, for example, the sputtering method. The storage layer 31 is formed of, for example, a compound, for example, CoFeB. The storage layer 31 has a relatively high Co concentration in order to suppress oxidation of the storage layer 31 (particularly Fe) in a process of oxidizing redeposits (reattachments) on a sidewall as described below.

Then, a tunnel barrier layer 32 is formed on the storage layer 31. The tunnel barrier layer 32 contains a nonmagnetic material, for example, MgO. The tunnel barrier layer 32 is formed to have a constant O concentration therein. The MgO layer forming the tunnel barrier layer 32 may be formed by directly depositing the MgO layer by the sputtering method targeted for MgO or depositing an Mg layer by the sputtering method targeted for Mg and then oxidizing the Mg layer. Desirably, for an increased magnetoresistive (MR) ratio, the MgO layer is directly deposited by the sputtering method targeted for MgO.

Then, a first reference layer 33A is formed on the tunnel barrier layer 32 by, for example, the sputtering method. Like the storage layer 31, the first reference layer 33A is formed of a compound, for example, CoFeB. The first reference layer 33A has a relatively high Fe concentration in order to increase perpendicular magnetic anisotropy. The Co—Fe alloy in the first reference layer 33A has a higher Fe concentration than the Co—Fe alloy in the storage layer 31.

Then, a second reference layer 33B is formed on the first reference layer 33A by, for example, the sputtering method. The second reference layer 33B contains a nonmagnetic material having a higher standard electrode potential E than the underlayer 41. Such a nonmagnetic material may be Pt, Pd, Ru, or W. Furthermore, the second reference layer 33B contains a magnetic material, for example, Co. That is, the second reference layer 33B is formed of a stack film of Pt and Co. The stack film is formed by stacking a plurality of Pt layers and a plurality of Co layers on one another. Such a second reference layer 33B is formed by changing the target of the sputtering method.

Then, an intermediate layer 42 formed of Ru is formed on the second reference layer 33B by, for example, the sputtering method. A shift cancelling layer 43 is formed on the intermediate layer 42. The shift cancelling layer 43 is formed of a superlattice or the like comprising a stack structure of a magnetic material such as Ni, Fe, or Co and a nonmagnetic material such as Cu, Pd, or Pt.

Subsequently, each layer of the magnetoresistive element MTJ is crystallized by annealing. At this time, O atoms migrate in the tunnel barrier layer 32 in response to an electric field generated by the standard electrode potentials of the layers formed above and below the tunnel barrier layer 32.

According to the first embodiment, the storage layer 31 with the high standard electrode potential E and the underlayer 41 with the low standard electrode potential E are formed below the tunnel barrier layer 32. Furthermore, the first reference layer 33A with the low standard electrode potential E and the second reference layer 33B with the high standard electrode potential E are formed above the tunnel barrier layer 32. Thus, the electric field applied to the tunnel barrier layer 32 can be reduced. This prevents the O atoms in the tunnel barrier layer 32 from migrating, thus allowing a state present at the time of formation of the MgO layer (the state with a constant O concentration) to be maintained.

The O concentration in the tunnel barrier layer 32 need not necessarily be constant and may be higher either on the storage layer 31 side or on the reference layer 33 side in the tunnel barrier layer 32 to the degree that the reliability of the tunnel barrier layer 32 is not degraded. Furthermore, the O concentration in the tunnel barrier layer 32 may be higher on the storage layer 31 side than on the reference layer 33 side in order to increase the perpendicular magnetic anisotropy of the storage layer 31.

Then, a hard mask not shown in the drawings is formed on the shift cancelling layer 43 and patterned so as to have, for example, a circular planar shape. The hard mask is formed of a conductive metal material, for example, TiN. Furthermore, the hard mask is not limited to TiN but may be formed of a film containing Ti, Ta, or W or a stack film of any of Ti, Ta, and W. Thus, the hard mask need not be subsequently removed but may be used as a contact section that contacts the upper electrode 28.

Then, the shift cancelling layer 43, the intermediate layer 42, the reference layer 33, the tunnel barrier layer 32, the storage layer 31, and the underlayer 41 are processed by physical etching such as ion beam etching (IBE) using the hard mask as a mask. Thus, the shift cancelling layer 43, the intermediate layer 42, the reference layer 33, the tunnel barrier layer 32, the storage layer 31, and the underlayer 41 are patterned similarly to the hard mask so as to have a circular planar shape.

At this time, the material forming the underlayer 41 is formed as redeposits on the sidewall of the tunnel barrier layer 32. The redeposits may cause short-circuiting between the storage layer 31 and the reference layer 33.

Thus, after the shift cancelling layer 43, the intermediate layer 42, the reference layer 33, the tunnel barrier layer 32, the storage layer 31, and the underlayer 41 are patterned, the redeposits formed on the sidewall of the tunnel barrier layer 32 are desirably oxidized into an insulator.

Here, the storage layer 31, having lower perpendicular magnetic anisotropy than the reference layer 33, contains Co-rich CoFeB. Co is more likely to be oxidized than Fe. That is, in the present example, the storage layer 31 is formed of Co-rich CoFeB to suppress the oxidation of the storage layer 31 (particularly Fe) in a redeposit oxidation process. Thus, the perpendicular magnetic anisotropy can be prevented from being degraded by the oxidation.

Subsequently, an interlayer insulating layer not shown in the drawings and which is formed of, for example, $SiO_2$ is formed all over the surface of the magnetoresistive element MTJ by, for example, a CVD method. Thus, the interlayer insulating layer is buried between adjacent magnetoresistive elements MTJ. Subsequently, the interlayer insulating layer formed on the magnetoresistive element MTJ is flattened and etched back. This exposes an upper surface of the magnetoresistive element MTJ. An upper electrode 28 is formed on and electrically connected to the exposed magnetoresistive element MTJ.

As described above, the magnetoresistive element MTJ according to the first embodiment is formed.

Effects of the First Embodiment

According to the first embodiment, in the magnetoresistive element MTJ, the storage layer 31 with the high Co concentration (with the high standard electrode potential E) and the underlayer 41 containing the material with the low standard electrode potential E are formed below the tunnel barrier layer 32. Furthermore, the first reference layer 33A with the high Fe concentration (with the low standard electrode potential E) and the second reference layer 33B containing the material with the low standard electrode potential E are formed above the tunnel barrier layer 32. For example, Co, which is contained in the storage layer 31 below the tunnel barrier layer 32 in a large amount, is −0.28 V in standard electrode potential E, and Hf, which is contained in the underlayer 41 below the tunnel barrier layer 32 in a large amount, is −1.55 V in standard electrode potential E. On the other hand, Fe, which is contained in the first reference layer 33A above the tunnel barrier layer 32 in a large amount, is −0.45 V in standard electrode potential E, and Pt, which is contained in the second reference layer 33B above the tunnel barrier layer 32 in a large amount, is −1.18 V in standard electrode potential E. Therefore, the following effects can be obtained.

Figure 5:
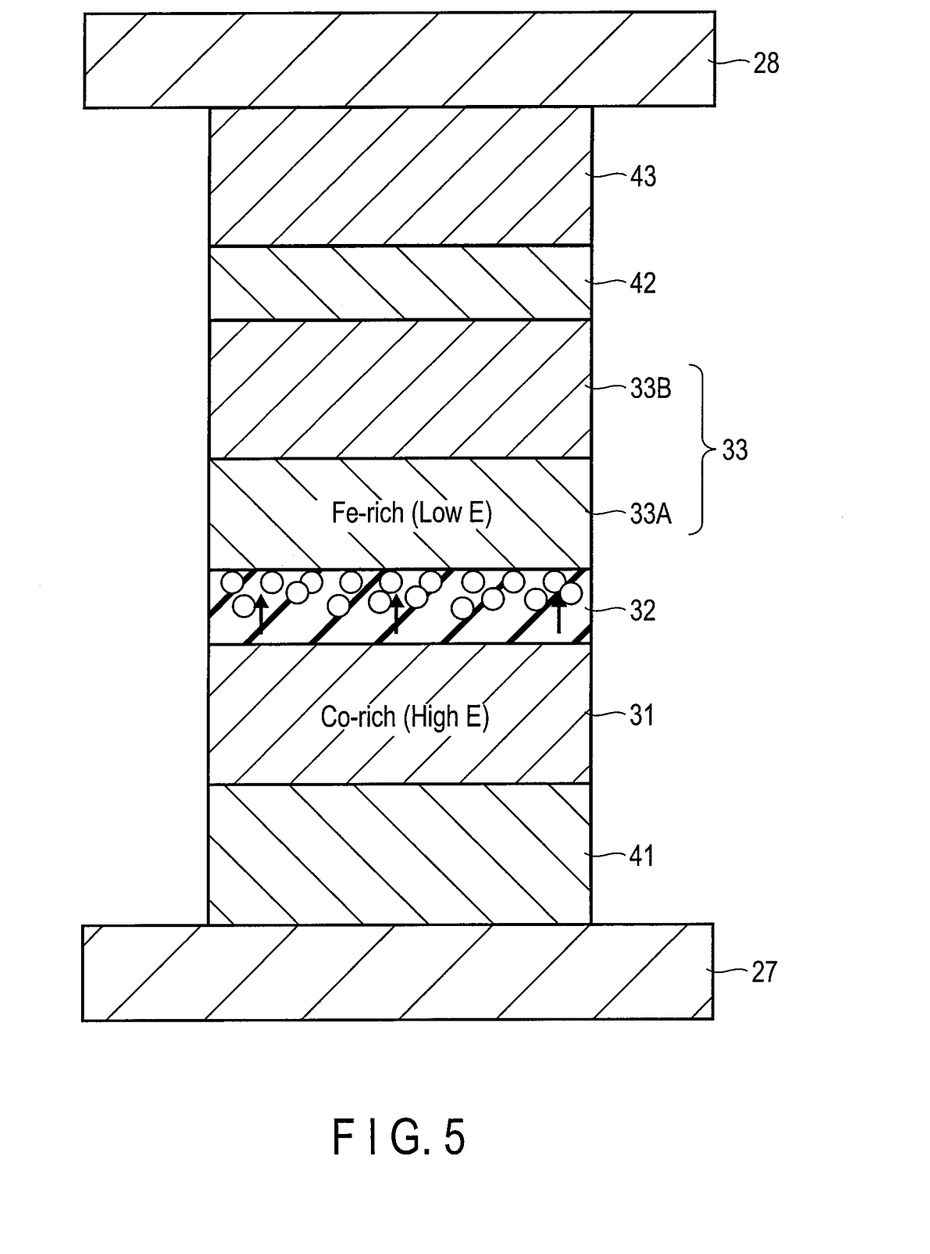
FIG. 5 is a cross-sectional view showing the structure of a magnetoresistive element MTJ in a comparative example.

FIG. 5 is a cross-sectional view showing the structure of a magnetoresistive element MTJ in a comparative example.

As shown in FIG. 5, the magnetoresistive element MTJ in the comparative example comprises a storage layer 31 with a high Co concentration (with a high standard electrode potential E [for example, −0.28 V]) formed below a tunnel barrier layer 32 and a first reference layer 33A with a high Fe concentration (with a low standard electrode potential E [for example, −0.45 V]) formed above the tunnel barrier layer 32. That is, the standard electrode potentials E of an underlayer 41 and a second reference layer 33B are not particularly adjusted.

In this case, when annealing is carried out during a manufacturing process, O atoms migrate in the tunnel barrier layer 32 in response to an electric field generated by the standard electrode potentials E of the storage layer 31 and the first reference layer 33A formed below and above the tunnel barrier layer 32, respectively. More specifically, the O atoms migrate toward the first reference layer 33A side with the lower standard electrode potential E. Thus, the O concentration in the tunnel barrier layer 32 is higher on the first reference layer 33A side. In other words, the O concentration in the tunnel barrier layer 32 is prevented from being constant. This in turn prevents a constant electric field from being applied to the tunnel barrier layer 32 when a current is passed through the tunnel barrier layer 32. Therefore the reliability of the tunnel barrier layer 32 is degraded.

In contrast, according to the first embodiment, the underlayer 41 containing the material with the low standard electrode potential E (for example, −1.55 V) is formed on the storage layer 31 side of (below) the tunnel barrier layer 32, and the second reference layer 33B with the high standard electrode potential E (for example, −1.18 V) is formed on the first reference layer 33A side of (above) the tunnel barrier layer 32. Consequently, when annealing is carried out during the manufacturing process, the O atoms are prevented from migrating, thus allowing the O concentration in the tunnel barrier layer 32 to be made constant. As a result, an electric field generated by the storage layer 31 and the first reference layer 33A can be cancelled, allowing an electric field applied to the tunnel barrier layer 32 when a current is passed through the tunnel barrier layer 32 to be made constant. Therefore, the reliability of the tunnel barrier layer 32 can be improved.

The above-described effects are more significant when an MgO layer (tunnel barrier layer 32) is formed by depositing an Mg layer by the sputtering method targeted for Mg and then oxidizing the Mg layer.

Second Embodiment

A magnetoresistive element MTJ according to a second embodiment will be described with reference to FIG. 6.

In the magnetoresistive element MTJ, if the underlayer 41 contains a nonmagnetic material with low perpendicular magnetic anisotropy, the storage layer 31, which is in contact with the underlayer 41, may have reduced perpendicular magnetic anisotropy of an insufficient magnitude.

In contrast, according to the second embodiment, the standard electrode potentials of the layers located above and below the tunnel barrier layer 32 serve to increase the O concentration on the storage layer 31 side of the tunnel barrier layer 32. Thus, Fe atom in the storage layer 31 and O atom can be bonded together to increase the perpendicular magnetic anisotropy of the storage layer 31, improving thermal stability (data retention characteristics). The second embodiment will be described below in detail.

Description of aspects of the second embodiment which are similar to the corresponding aspects of the first embodiment is omitted, and mainly differences from the first embodiment will be described below.

Structure According to the Second Embodiment

The structure of the magnetoresistive element MTJ according to the second embodiment will be described below with reference to FIG. 6.

Figure 6:
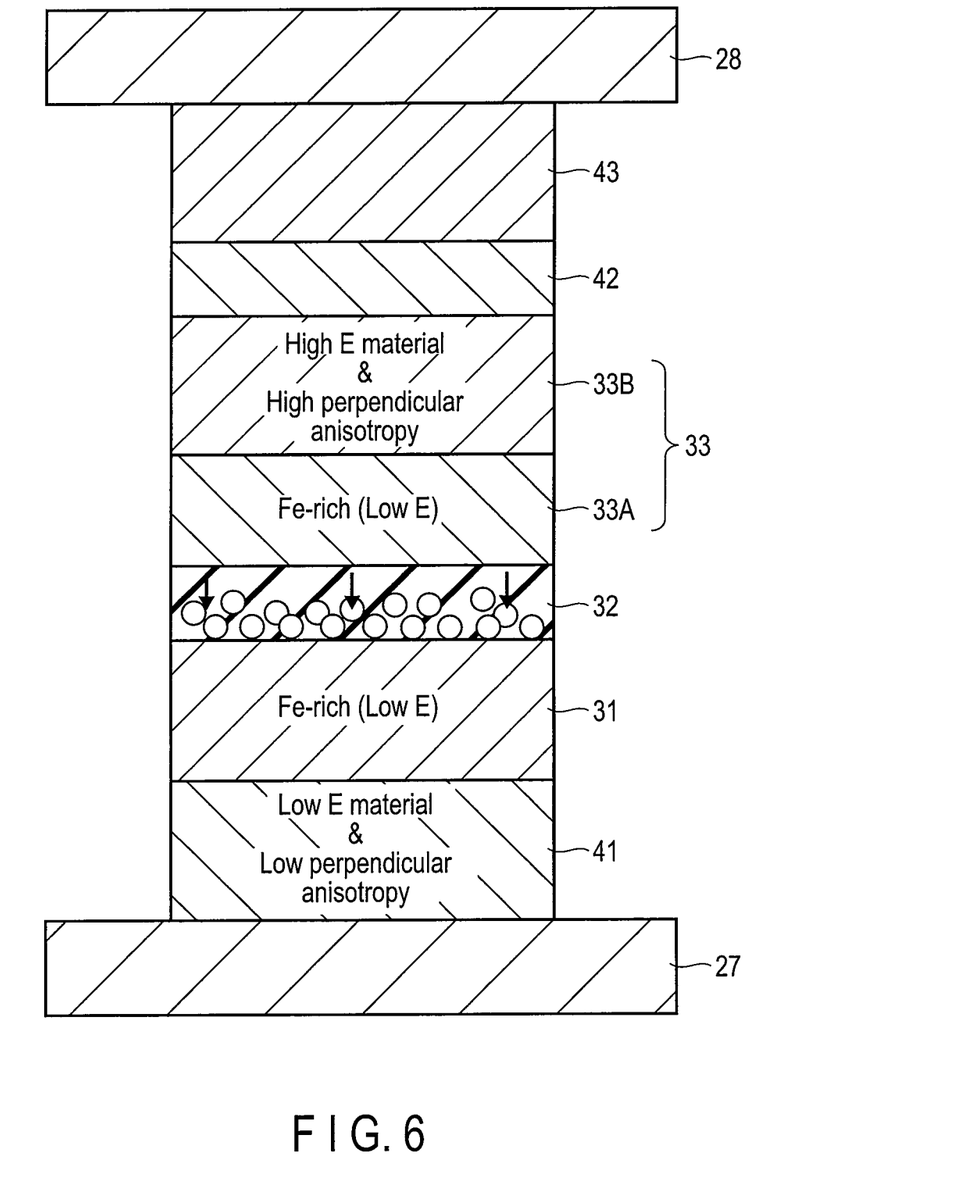
FIG. 6 is a cross-sectional view showing the structure of a magnetoresistive element according to a second embodiment.

FIG. 6 is a cross-sectional view showing the structure of the magnetoresistive element MTJ according to the second embodiment.

As shown in FIG. 6, the second embodiment is different from the first embodiment in that the storage layer 31 has a high Fe concentration and a standard electrode potential equivalent to the standard electrode potential of the first reference layer 33A and in that the underlayer 41 has low perpendicular magnetic anisotropy, whereas the second reference layer 33B has high perpendicular magnetic anisotropy. The structure of the magnetoresistive element MTJ according to the second embodiment will be described below in further detail.

The underlayer 41 contains a nonmagnetic material having a lower standard electrode potential E than the second reference layer 33B. Such a nonmagnetic material may be, for example, Hf, but is not limited to this. The nonmagnetic material may be Ta, Nb, Al, or Ti. Alternatively, the nonmagnetic material may be HfN, TaN, NbN, AlN, or TiN. Alternatively, alloys or stack films of these materials may be used.

Furthermore, these nonmagnetic materials have lower perpendicular magnetic anisotropy than a nonmagnetic material forming the second reference layer 33B described below. Thus, the storage layer 31, which is in contact with the underlayer 41, has lower perpendicular magnetic anisotropy than the first reference layer 33A, which is in contact with the second reference layer 33B.

The storage layer 31 is formed on the underlayer 41. The storage layer 31 contains ferromagnetic materials, for example, Co and Fe. Furthermore, B is added to the ferromagnetic materials in order to adjust saturation magnetization, magneto crystalline anisotropy, or the like. That is, the storage layer 31 is formed of a compound, for example, CoFeB. The storage layer 31 has a relatively high Fe concentration in order to increase perpendicular magnetic anisotropy. The Fe concentration of the Co—Fe alloy in the storage layer 31 is the same as the Fe concentration of the Co—Fe alloy in the first reference layer 33A and is, for example, about 70 atm % or more.

The tunnel barrier layer 32 is formed on the storage layer 31. The tunnel barrier layer 32 contains a nonmagnetic material, for example, MgO. However, the tunnel barrier layer 32 is not limited to the nonmagnetic material but may contain a metal oxide such as $Al_2O_3$, MgAlO, ZnO, or TiO. The O concentration in the tunnel barrier layer 32 is higher on the storage layer 31 side than on the first reference layer 33A side.

The reference layer 33 is formed on the tunnel barrier layer 32. The reference layer 33 is formed of a first reference layer 33A on a lower side and a second reference layer 33B on an upper side.

The first reference layer 33A is formed on the tunnel barrier layer 32. The reference layer 33A contains ferromagnetic materials, for example, Co and Fe. Furthermore, B is added to the ferromagnetic materials in order to adjust saturation magnetization, magneto crystalline anisotropy, or the like. That is, like the storage layer 31, the first reference layer 33A is formed of a compound, for example, CoFeB. The first reference layer 33A has a relatively high Fe concentration in order to increase perpendicular magnetic anisotropy. The Fe concentration of the Co—Fe alloy in the first reference layer 33A is the same as the Fe concentration of the Co—Fe alloy in the storage layer 31 and is, for example, about 70 atm % or more. In other words, the first reference layer 33A and the storage layer 31 have similar configurations and similar composition ratios. Thus, the first reference layer 33A and the storage layer 31 have relatively low, similar standard electrode potentials.

Both the storage layer 31 and the first reference layer 33A may have a relatively high Co concentration instead of the relatively high Fe concentration. That is, the Co concentration of the Co—Fe alloy in the storage layer 31 and the first reference layer 33A is about 30 atm % or more and 70 atm % or less.

The second reference layer 33B is formed on the first reference layer 33A. The second reference layer 33B contains a nonmagnetic material having a higher standard electrode potential E than the underlayer 41. Such a nonmagnetic material may be Pt. Furthermore, the second reference layer 33B contains a magnetic material, for example, Co. That is, the second reference layer 33B is formed of, for example, a stack film of Pt and Co. The stack film is formed by stacking a plurality of Pt layers and a plurality of Co layers on one another. The nonmagnetic material with the high standard electrode potential E is not limited to Pt but may be Pd.

Furthermore, the nonmagnetic material (Pt or Pd) has higher perpendicular magnetic anisotropy than the nonmagnetic material forming the underlayer 41. Thus, the first reference layer 33A, which is in contact with the second reference layer 33B, has higher perpendicular magnetic anisotropy than the storage layer 31, which is in contact with the underlayer 41.

As described above, according to the second embodiment, the storage layer 31 with the high Fe concentration (with the low standard electrode potential E) and the underlayer 41 with the low standard electrode potential E are formed below the tunnel barrier layer 32. Furthermore, the first reference layer 33A with the high Fe concentration (with the low standard electrode potential E) and the second reference layer 33B with the high standard electrode potential E are formed above the tunnel barrier layer 32. This enables a reduction in the potential of the lower side (storage layer 31 side) of the tunnel barrier layer 32 and an increase in the O concentration of the lower side of the tunnel barrier layer 32. As a result, the perpendicular magnetic anisotropy of the storage layer 31 can be increased.

Method for Manufacturing According to the Second Embodiment

A method for manufacturing the magnetoresistive element MTJ according to the second embodiment will be described below with reference to FIG. 6.

First, an underlayer 41 is formed on the lower electrode 27 by, for example, the sputtering method. The underlayer 41 contains a nonmagnetic material having a lower standard electrode potential E than the second reference layer 33B. The nonmagnetic material may be Hf, Ta, Nb, Al, Ti, HfN, TaN, NbN, AlN, or TiN. These nonmagnetic materials have lower perpendicular magnetic anisotropy than a nonmagnetic material forming the second reference layer 33B.

Then, a storage layer 31 is formed on the underlayer 41 by, for example, the sputtering method. The storage layer 31 is formed of a compound, for example, CoFeB. The storage layer 31 has a relatively high Fe concentration in order to increase perpendicular magnetic anisotropy.

Then, a tunnel barrier layer 32 is formed on the storage layer 31. The tunnel barrier layer 32 contains a nonmagnetic material, for example, MgO. The tunnel barrier layer 32 is formed to have a constant O concentration therein. The MgO layer forming the tunnel barrier layer 32 may be formed by directly depositing the MgO layer by the sputtering method targeted for MgO or depositing an Mg layer by the sputtering method targeted for Mg and then oxidizing the Mg layer.

Then, a first reference layer 33A is formed on the tunnel barrier layer 32 by, for example, the sputtering method. Like the storage layer 31, the first reference layer 33A is formed of a compound, for example, CoFeB. The first reference layer 33A has a relatively high Fe concentration in order to increase perpendicular magnetic anisotropy. The Co—Fe alloy in the first reference layer 33A has the same Fe concentration as that of the Co—Fe alloy in the storage layer 31. In other words, the first reference layer 33B and the storage layer 31 have similar configurations and similar composition ratios. Thus, the first reference layer 33A and the storage layer 31 have relatively low, similar standard electrode potentials.

Then, a second reference layer 33B is formed on the first reference layer 33A by, for example, the sputtering method. The second reference layer 33B contains a nonmagnetic material having a higher standard electrode potential E than the underlayer 41. Such a nonmagnetic material may be Pt or Pd. Furthermore, the second reference layer 33B contains a magnetic material, for example, Co. That is, the second reference layer 33B is formed of a stack film of Pt and Co. The stack film is formed by stacking a plurality of Pt layers and a plurality of Co layers on one another. Such a second reference layer 33B is formed by changing the target of the sputtering method.

Additionally, the nonmagnetic material (Pt or Pd) has higher perpendicular magnetic anisotropy than the nonmagnetic substance forming the underlayer 41. Thus, the first reference layer 33A, which is in contact with the second reference layer 33B, has higher perpendicular magnetic anisotropy than the storage layer 31, which is in contact with the underlayer 41.

Then, an intermediate layer 42 formed of Ru is formed on the second reference layer 33B by, for example, the sputtering method. A shift cancelling layer 43 is formed on the intermediate layer 42. The shift cancelling layer 43 is formed of a superlattice or the like comprising a stack structure of a magnetic material such as Ni, Fe, or Co and a nonmagnetic material such as Cu, Pd, or Pt.

Then, a hard mask not shown in the drawings is formed on the shift cancelling layer 43 and patterned so as to have, for example, a circular planar shape. The hard mask is formed of a conductive metal material, for example, TiN. Furthermore, the hard mask is not limited to TiN but may be formed of a film containing Ti, Ta, or W or a stack film of any of Ti, Ta, and W. Thus, the hard mask need not be subsequently removed but may be used as a contact section that contacts the upper electrode 28.

Then, the shift cancelling layer 43, the intermediate layer 42, the reference layer 33, the tunnel barrier layer 32, the storage layer 31, and the underlayer 41 are processed by physical etching such as ion beam etching (IBE) using the hard mask as a mask. Thus, the shift cancelling layer 43, the intermediate layer 42, the reference layer 33, the tunnel barrier layer 32, the storage layer 31, and the underlayer 41 are patterned similarly to the hard mask so as to have a circular planar shape.

Subsequently, an interlayer insulating layer not shown in the drawings and which is formed of, for example, $SiO_2$ is formed all over the surface of the magnetoresistive element MTJ by, for example, the CVD method. Thus, the interlayer insulating layer is buried between adjacent magnetoresistive elements MTJ. Subsequently, the interlayer insulating layer formed on the magnetoresistive element MTJ is flattened and etched back. This exposes an upper surface of the magnetoresistive element MTJ. An upper electrode 28 is formed on and electrically connected to the exposed magnetoresistive element MTJ.

Subsequently, each layer of the magnetoresistive element MTJ is crystallized by annealing. At this time, O atoms migrate in the tunnel barrier layer 32 in response to an electric field generated by the standard electrode potentials of the layers formed above and below the tunnel barrier layer 32.

According to the second embodiment, the first reference layer 33A and the storage layer 31, which have an equivalent standard electrode potential, are formed above and below the tunnel barrier layer 32, respectively. Moreover, the second reference layer 33B with the high standard electrode potential E is formed above the first reference layer 33A. The underlayer 41 with the low standard electrode potential E is formed below the storage layer 31. That is, the storage layer 31 side (lower side) of the tunnel barrier layer 32 has a reduced standard electrode potential E, resulting in an electric field in the tunnel barrier layer 32. As a result, the O atoms in the tunnel barrier layer 32 migrate toward the storage layer 31 side with the low standard electrode potential E and bond to the Fe atoms in the storage layer 31. This enables an increase in the perpendicular magnetic anisotropy of the storage layer 31.

As described above, the magnetoresistive element MTJ according to the second embodiment is formed.

Effects According to the Second Embodiment

In the magnetoresistive element MTJ, if the underlayer 41 contains a nonmagnetic material with low perpendicular magnetic anisotropy, the storage layer 31, which is in contact with the underlayer 41, may have reduced perpendicular magnetic anisotropy of an insufficient magnitude.

In contrast, according to the second embodiment, the storage layer 31 has an Fe concentration higher than in the first embodiment. Thus, compared to the first embodiment, the second embodiment enables an increase in the perpendicular magnetic anisotropy of the storage layer 31.

Furthermore, the first reference layer 33A and the storage layer 31, which are equivalent in standard electrode potential, are formed on the tunnel barrier layer 32. Moreover, the second reference layer 33B containing the nonmagnetic material with the high standard electrode potential E is formed above the first reference layer 33A. The nonmagnetic material with the low standard electrode potential E is formed below the storage layer 31. This reduces the standard electrode potential E of the storage layer 31 side (lower side) of the tunnel barrier layer 32, resulting in an electric field in the tunnel barrier layer 32. Thus, during the manufacturing process, the O atoms in the tunnel barrier layer 32 migrate toward the storage layer 31 side with the low standard electrode potential E and bond to the Fe atoms in the storage layer 31. This enables an increase in the perpendicular magnetic anisotropy of the storage layer 31 and allows the thermal stability of the storage layer 31 to be improved.

At this time, the second reference layer 33B containing the nonmagnetic material (Pt or Pd) with the high perpendicular magnetic anisotropy is formed on the first reference layer 33A. Thus, even with the O concentration on the first reference layer 33A side of the tunnel barrier layer 32 reduced, the first reference layer 33A has sufficient perpendicular magnetic anisotropy.

Each of the above described MTJ structures can be introduced as MTJ elements of memory cells. Memory cells, memory cell arrays and memory devices are disclosed in U.S. patent application Ser. No. 13/420,106, Asao, the entire contents of which are incorporated by reference herein.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistive element comprising:
   a storage layer having perpendicular magnetic anisotropy with respect to a film plane and having a variable direction of magnetization;
   a reference layer having perpendicular magnetic anisotropy with respect to the film plane and having an invariable direction of magnetization;
   a tunnel barrier layer formed between the storage layer and the reference layer and containing 0; and
   an underlayer formed on a side of the storage layer opposite to the tunnel barrier layer, wherein the reference layer comprises a first reference layer formed on the tunnel barrier layer side and a second reference layer formed opposite the tunnel barrier layer, the second reference layer has a higher standard electrode potential than the underlayer, and the storage layer and the first reference layer contain Co and Fe, and the storage layer has a lower Fe concentration than the first reference layer.

2. The element of claim 1, wherein an O concentration in the tunnel barrier layer is constant.

3. The element of claim 1, wherein the storage layer has a higher standard electrode potential than the first reference layer.

4. The element of claim 1, wherein the second reference layer contains Pt, Pd, Ru, or W.

5. The element of claim 1, wherein the underlayer contains Hf, Ta, Nb, Al, Ti, HfN, TaN, NbN, AlN, or TiN.

6. The element of claim 1, wherein the underlayer has a greater film thickness than the storage layer.

7. The element of claim 1, wherein the second reference layer has a greater film thickness than the first reference layer.

8. The element of claim 1, wherein the tunnel barrier layer contains MgO, $Al_2O_3$, MgAlO, ZnO, or TiO.

9. A magnetoresistive element comprising:
a storage layer having perpendicular magnetic anisotropy with respect to a film plane and having a variable direction of magnetization;
a reference layer having perpendicular magnetic anisotropy with respect to a film plane and having an invariable direction of magnetization;
a tunnel barrier layer formed between the storage layer and the reference layer and containing O; and
an underlayer formed on a side of the storage layer opposite to the tunnel barrier layer and containing Hf, Ta, Nb, Al, Ti, HfN, TaN, NbN, AlN, or TiN,
wherein the reference layer comprises a first reference layer formed on the tunnel barrier layer side and a second reference layer formed opposite the tunnel barrier layer and containing Pt or Pd, and
the storage layer and the first reference layer contain Co and Fe, and the storage layer is equal to the first reference layer in Fe concentration.

10. The element of claim 9, wherein the storage layer and the first reference layer have an Fe concentration of about 70 atm % or more.

11. The element of claim 9, wherein an O concentration in the tunnel barrier layer is higher on the storage layer side than on the reference layer side.

12. The element of claim 9, wherein the storage layer is equal to the first reference layer in standard electrode potential.

13. The element of claim 9, wherein the second reference layer has a higher standard electrode potential than the underlayer.

14. The element of claim 9, wherein the second reference layer contains Co and comprises a stack film of Pt or Pd and Co.

15. The element of claim 9, wherein the underlayer has a greater film thickness than the storage layer.

16. The element of claim 9, wherein the second reference layer has a greater film thickness than the first reference layer.

17. The element of claim 9, wherein the tunnel barrier layer contains MgO, $Al_2O_3$, MgAlO, ZnO, or TiO.

18. A magnetoresistive element comprising:
a storage layer having perpendicular magnetic anisotropy with respect to a film plane and having a variable direction of magnetization;
a reference layer having perpendicular magnetic anisotropy with respect to the film plane and having an invariable direction of magnetization;
a tunnel barrier layer formed between the storage layer and the reference layer and containing 0; and
an underlayer formed on a side of the storage layer opposite to the tunnel barrier layer,
wherein the reference layer comprises a first reference layer formed on the tunnel barrier layer side and a second reference layer formed opposite the tunnel barrier layer, and
the second reference layer has a higher standard electrode potential than the underlayer.

19. The element of claim 18, wherein the storage layer and the first reference layer contain Co and Fe, and the storage layer is equal to the first reference layer in Fe concentration.

20. The element of claim 18, wherein an O concentration in the tunnel barrier layer is higher on the storage layer side than on the reference layer side.

* * * * *